United States Patent
Rombult et al.

[11] Patent Number: 6,084,602
[45] Date of Patent: Jul. 4, 2000

[54] IMAGING SYSTEM WITH HIGH EFFICIENCY MEDIA LOADING

[75] Inventors: Philip A. Rombult, Bradford; David B. Larsen, Woburn, both of Mass.

[73] Assignee: Agfa Corporation, Wilmington, Mass.

[21] Appl. No.: 08/868,970

[22] Filed: Jun. 4, 1997

[51] Int. Cl.[7] ......................................................... B41J 2/47
[52] U.S. Cl. .............................. 346/134; 347/262; 271/11
[58] Field of Search ..................................... 346/134, 138; 399/364, 401; 347/262, 264; 271/3.14, 3.18, 3.21, 11, 14, 10.14, 10.16, 107

[56] References Cited

U.S. PATENT DOCUMENTS

| 5,323,220 | 6/1994 | Yasuda | 346/134 |
| 5,604,577 | 2/1997 | Waduka et al. | 399/264 |

*Primary Examiner*—N. Le
*Assistant Examiner*—Lamson D. Nguyen
*Attorney, Agent, or Firm*—Alfred A. Stadnicki; Edward L. Kelley

[57] ABSTRACT

An imaging system for imaging media while supported at an imaging position on a support surface, the imaging system, includes a storage device for storing media to be imaged and a loading device for moving a medium to be imaged to the imaging position on the support surface. A delivery device moves the medium to be imaged over the support surface at a distanced therefrom, to thereby deliver the medium from the storage device to the loading device. By moving the medium to be imaged over the support surface, the medium can be removed from the storage device and buffered close to the loading device while another medium is positioned on the support surface.

32 Claims, 9 Drawing Sheets

IMAGING SYSTEM WITH HIGH EFFICIENCY MEDIA LOADING

RELATED APPLICATIONS

The present application is related to simultaneously filed copending U.S. application Ser. No. 08/860,720 entitled "IMAGING SYSTEM WITH MOVABLE REGISTRATION PINS", Ser. No. 08/868,969 entitled "REGISTRATION DETECTION APPARATUS FOR IMAGING SYSTEMS", Ser. No. 08/867,128 entitled "A METHOD AND APPARATUS FOR SELECTIVELY DRAWING AIR FROM A PLURALITY OF VACUUM CHANNELS", Ser. No. 08/868,526 entitled "METHOD AND APPARATUS FOR HOLDING RECORDING MEDIA ONTO A MEDIA SUPPORT SURFACE".

TECHNICAL FIELD

The present invention relates to imaging systems such as platesetters and imagesetters and more particularly to imaging systems having highly efficient loading and unloading of media.

BACKGROUND ART

Modern imagesetters and platesetters utilize optical scanners to write or record images for subsequent reproduction or to read a prerecorded image at a predefined resolution rate. Such scanners may write or record images on or read prerecorded images from various media including photo or thermal sensitive paper or polymer films, photo or thermal sensitive coatings or erasable imaging materials, an aluminum or other metal base printing plate, or other type media. The medium is typically mounted on an imaging surface which may be planar or curved and then scanned with an optical beam.

The primary components of modern imagesetting and platesetting systems include an image processor, which may be in the form of a personal computer or workstation, to generate and/or edit an image, a raster image processor (RIP) for converting data signals from the image processor into signals which can be understood by an engine or system controller which controls the scanning of the optical beam on the medium. The imagesetter or platesetter itself typically includes an engine having a scan assembly. The scan assembly may, for example, be disposed and movable within a drum cylinder in which the recording or recorded medium is mounted. The controller, in accordance with the signals from the RIP and its own programmed instructions, generates signals to control the optical scanning so as to write images on or read images from the medium mounted within the drum cylinder by scanning one or more optical beams over the inside circumference of the drum cylinder while the cylinder itself remains fixed. A typical scan assembly of a cylindrical drum type imager system may include a spin mirror or other optical device to direct the light beam over the inside circumference of the drum cylinder, as will be well understood by one skilled in the art. Modern imaging system also typically include a loading device, often referred to as an applicator, for loading media onto and removing media from the media support surface of, for example, the drum cylinder.

Imaging systems may also include other components. Typically, imaging systems include a media storage device for storing the media to be imaged by the imager, e.g. the imagesetter or platesetter. The system often additionally includes an imaged media processor which develops or otherwise processes media imaged by the imager. If these components are included in the system, the imaging system must also include devices, which may for example be electromechanical assemblies, to deliver the media from the storage device to the imager loading device and from the imager to the imaged media processor.

To provide efficient operation, conventional imaging systems load media onto, for example, the internal surface of a cylindrical drum from one side of the drum and remove the imaged media from the other side of the drum. This results in the media having a short travel distance between the media storage device and entry into the cylindrical drum of the imager. To keep this distance as short as possible, designers attempt to locate the media storage device as close as possible to the imager. Accordingly, in operation, the system's media delivery device moves a sheet of media from the storage device to an applicator which inserts the media, leading edge first, onto the support surface of the cylindrical drum from the side of the cylindrical drum closest to the storage device. The applicator moves the media into the desired position on the internal surface of the cylindrical drum prior to imaging by the scan assembly.

Once the imaging is completed, the applicator removes the imaged media from the internal surface of the cylindrical drum, leading edge first, and out of the far side of the drum to an imaged media delivery device. The imaged media delivery device then continues the movement of the imaged media, leading edge first, to the imaged media processor. The imaged media processor is also typically designed to be located as close as possible to the far side of the cylindrical drum to reduce the distance over which the imaged media travels. The media is then moved into the imaged media processor where development of the imaged media occurs.

In the typical operational sequencing of conventional imaging systems, the media delivery device typically remains in a parked position during the positioning of the media on and removal of the imaged media from the cylindrical drum, as well as during the imaging of the media. Only after the imaged media has been removed from the internal surface of the cylindrical drum, and often only after the imaged media has been removed entirely from the cylindrical drum, does the media delivery device remove another sheet of media from the storage device and deliver it to the loading device.

Further, the imaged media is not removed from the internal surface of the cylindrical drum until the imaged media processor has been emptied. More particularly, if another sheet of imaged media is being developed in the imaged media processor, after imaging a sheet of media in the cylindrical drum, the imaged media in the cylindrical drum is not removed from the cylindrical drum until the imaged media being developed in the imaged plate processor is removed from the processor.

Because the movement of the media from the storage device to the imaged media processor in conventional systems proceeds in a single direction, i.e., a single edge of each respective sheet of media leads the movement of the sheet throughout the process, and the media is loaded into the cylindrical drum from the side of the cylindrical drum closest to the storage device and removed from the side of the cylindrical drum closest to the imaged media processor, the imaged media must be stored emulsion side up. Hence, although it is beneficial to store media with the emulsion side down for numerous reasons which are well known in the art, in conventional systems the media is consistently stored emulsion side up due to the travel path of the media.

OBJECTIVES OF THE INVENTION

Accordingly, it is an object of the present invention to provide an imaging system which loads and unloads medium with enhanced efficiency.

It is a another object of the present invention to provide an imaging system which facilitates the storage of the media emulsion side down.

It is a further object of the present invention to provide an imaging system which facilitates the imaging of different size media.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

SUMMARY DISCLOSURE OF THE INVENTION

In accordance with the invention, an imaging system is provided which images media supported at an imaging position on a support surface. The support surface may be planar or curved and may, for example, be the internal surface of a cylindrical drum imager. The system may perform operations on the media one sheet at a time, although this is not mandatory. The imaging system includes a storage device for storing the media to be imaged. The storage device preferably includes a media handler for simultaneously storing different size media. Beneficially, the storage device stores the media with the emulsion side down.

The handler is controlled by a controller in accordance with a signal, generated by an input device, such as a personal computer or other operator control subsystem, which represents an operator's command selecting one of the differing size media. The media size selection may be made by the operator entering a command on the input device which identifies a particular cassette within the handler or the desired size itself, or some other operating parameter which the system understands to correspond to the desired media size.

The controller controls the handler so that the selected media is accessible to a device which will remove the media from the storage device for delivery to the media support surface for imaging. Thus, the controller controls the handler such that the system's media delivery device is provided with access to stored media of the selected type so that it can remove a sheet of the media from the storage device and begin the delivery process.

The media delivery device is preferably a media picker but could be any other type of device capable of delivering media from a storage device in accordance with the invention. The device moves the media to be imaged from the storage device to a loading device which will subsequently move the media to the imaging position on the support surface. Advantageously, the media delivery device moves the sheet of media to be imaged from the storage device to a position over the support surface and distanced therefrom. Because the media is advantageously stored emulsion side down, the delivery device is preferably configured to contact the media from above, to avoid contacting the emulsion side of the media. In the preferred embodiment of the invention which is described below, the delivery device is configured with suction cups and contacts only the non-emulsioned side of the media during removal from the storage device and transport to the loading device The loading device, which is commonly referred to as an applicator, moves the media to be imaged to the imaging position on the support surface and removes the medium from the support surface, typically after imaging is completed. Often, particularly in cylindrical drum imagers, the medium to be imaged is moved along the support surface during the positioning of the medium on the support surface and during removal of the medium from the support surface. Preferably, the leading edge and trailing edge of the medium as it is moved onto the support surface by the loading device are reversed when the medium is removed from the support surface by the loading device. That is the leading and trailing edges of the medium as it is moved onto the support surface respectively become the trailing edge and the leading edge of the medium it is removed from the support surface. Hence, the media travels in one direction to be positioned onto the support surface and in a reverse direction to be removed from the support surface.

An engine controller, which is sometimes referred to as an imaging system controller, is provided for controlling the media delivery device and the loading device, as well as other system components. The engine controller is interconnected with the input device and typically operates in accordance with operator commands entered on the input device, such as a resolution selection and media size selection.

Preferably, the engine controller simultaneously controls the delivery device to move one sheet of media to be imaged, e.g. a first plate, from the storage device to a position proximate to the loading device and the loading device to move another sheet of media to be imaged, e.g. a second plate, to the imaging position on the support surface. According to other aspects of the invention, the engine controller controls the delivery device to buffer, for example, the first sheet of medium over the support surface and distanced therefrom prior to second sheet of medium being removed from the support surface.

According to still further aspect of the invention, the engine controller beneficially controls the media delivery device to, for example, move a first sheet of media from the storage device to a location proximate to the loading device after the loading device has begun to move a second sheet of media to the imaging position on the support surface but before the loading device has removed the imaged second sheet of media from the support surface. The controller advantageously is further configured to control the media delivery device to maintain the first sheet of medium in a buffer position, which is preferably proximate to the loading device, prior to the second sheet of medium being removed from the support surface. The proximity of the location to the loading device may vary depending on the implementation; however, the first sheet of media is beneficially moved to a location which is closer to the loading device than the media storage device and preferably as close as practical to a position of the loading device which will provide fast loading onto the support surface when required.

In accordance with other aspects of the invention, a media processor may be provided to process the imaged media. If so, an imaged media delivery device moves the imaged media from the loading device to the media processor. The engine controller controls the imaged media delivery device to move an imaged sheet of media from the loading device to a location proximate to the media processor before another imaged sheet of media has been removed from the image processor. The proximity of the location to the media processor may of course vary depending on the implementation; however, the imaged sheet of media should be moved to a location which is closer to the media processor than the loading device and preferably as close a practical to the media processor in order to provide fast loading into the media processor when required.

Advantageously, the controller is further configured to control the imaged media delivery device to maintain the sheet of imaged medium in a buffer position prior to the other sheet of imaged medium being removed from the image processor. The controller may also be configured to simultaneously control the media delivery device to move a first sheet of media from the storage device to the loading device, the loading device to move a second sheet of media to the imaging position on the support surface, and the imaged media delivery device to move an imaged third sheet of media from the loading device to the media processor.

According to yet another aspect of the invention, the media delivery device buffers a first sheet of media between the storage device and the loading device prior to the loading device removing a second sheet of media from the support surface, and the imaged media delivery device buffers an imaged third sheet of media between the loading device and the media processor prior to a fourth sheet of media being removed from the image processor. Preferably, the buffering by both devices is performed at the same time.

BEST MODE FOR CARRYING OUT THE INVENTION

Figure 1:
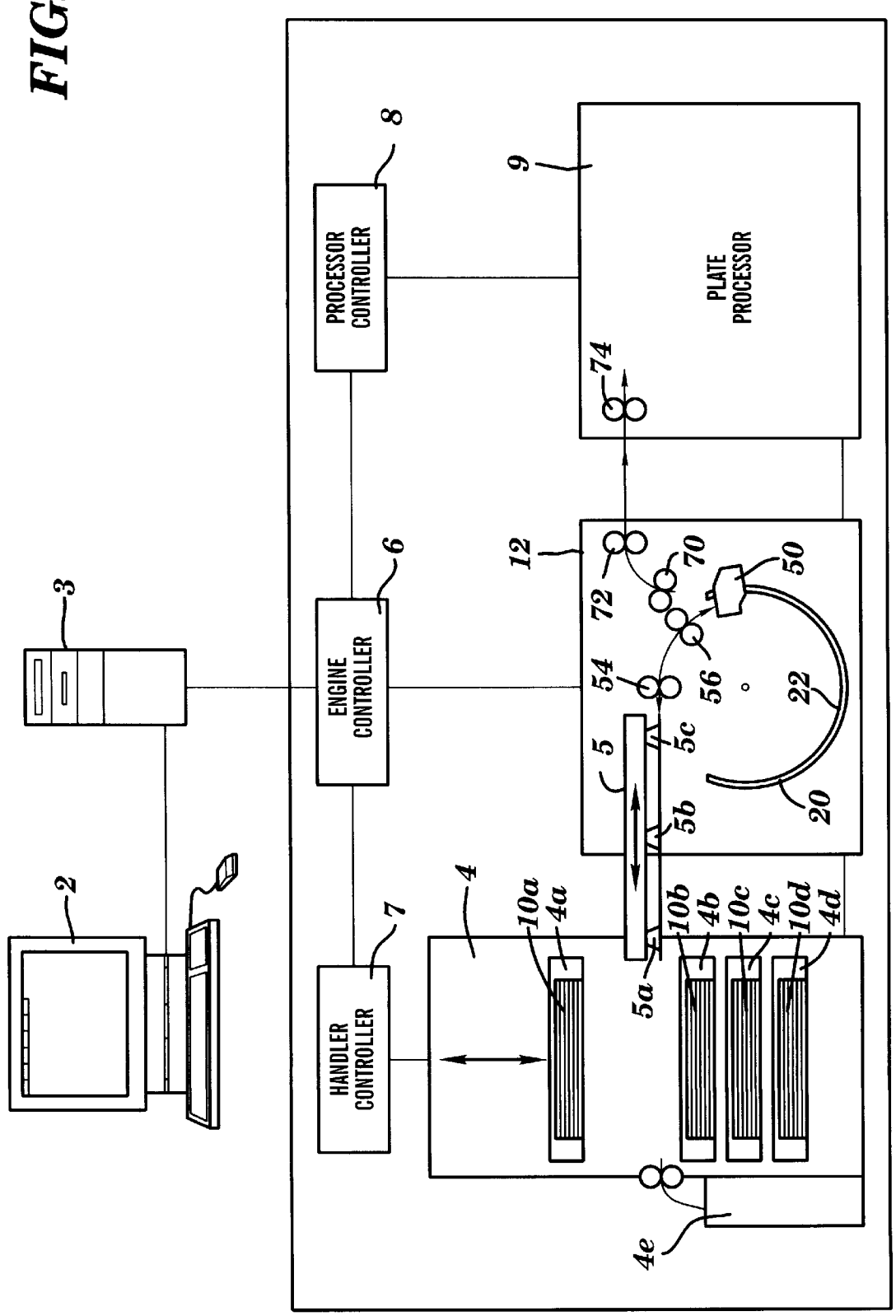
FIG. 1 depicts an imaging system in accordance with the present invention.

FIG. 1 depicts an imaging system in accordance with the present invention. As shown, the imaging system includes a computer 2 which may be virtually any type of computing device. The computer 2 allows images to be created or edited and serves as a general operator input device to the depicted imaging system. For example, the computer 2 can be utilized to select a particular scanning resolution and particular size media to be used during a particular operational sequence.

The imaging system further includes a stacked plate storage device or handler 4 which is controlled by the handler controller 7. The stacked plate handler 4 stores media 10a–10d of various sizes in respective cassettes 4a–4d. The handler 4 also includes a media feeder 4e for loading media to be imaged into the cassettes. As indicated, the cassettes 4a–d are movable vertically to position a desired cassette below the media delivery device or plate picker 5, to provide the plate picker 5 with access to media of the selected size. The plate picker 5 is part of the system engine 12. The plate picker 5 then conveys the individual sheets of media to the applicator 50 for loading into the cylindrical drum 20.

The system operator can identify or select a desired plate size using the computer 2 keyboard or mouse, for example, to select one of multiple plate sizes displayed on a monitor of the computer 2 or to input a desired plate size or a cassette number representing the cassette in which plates of the desired size are stored. The identification or selection of the desired plate size on the computer 2 results in the generation and transmission of a signal by the computer 2 to the RIP 3 which is transformed into an appropriate signal to the handler controller 7. In accordance with this signal, the controller 7 controls the handler 4 in the manner previously described such that the desired size plates can be accessed and conveyed by the plate picker 5 to the applicator 50 of the engine 12.

The plate picker 5, removes a sheet of media from the applicable cassette, i.e. cassette 4b as shown, by lifting the media by activating suction cups 5a–5c. The picker 5 then conveys the removed media, via nips 54 and 56, to the applicator 50 of the engine 12.

Images are transmitted from the computer 2 to the raster image processor (RIP) 3 which converts the digitized signals received from the computer 2 into signals which can be understood by the engine controller 6 to control the engine 12. The plate picker 5 which operates in conjunction with the stacked plate handler 4 and the applicator 50 to convey individual sheets of media, i.e. individual plates as shown, from the storage device handler 4 onto the mounting surface 22 of the cylindrical drum 20. Once properly positioned by the applicator 50 on the mounting surface 22, the medium is scanned by a scanning light beam radiating from a moving scan assembly (not shown) in accordance with the instructions from the engine controller 6 responsive to the signals received from the RIP 3.

When the imaging has recorded graphics or data on the imaged sheet of media, the sheet of media is then transferred, via the imaged media delivery device which is shown as nips 70–74, to the imaged media processor 9. The imaged processor 9 is controlled by the processor controller 8 in accordance with signals received from the RIP 3 to develop or otherwise process the imaged media. The imaged media processor 9 is shown to be a plate processor, however the type of media processor will of course be determined by the type of media being imaged. The processed media is then removed from the system.

Figure 2A:
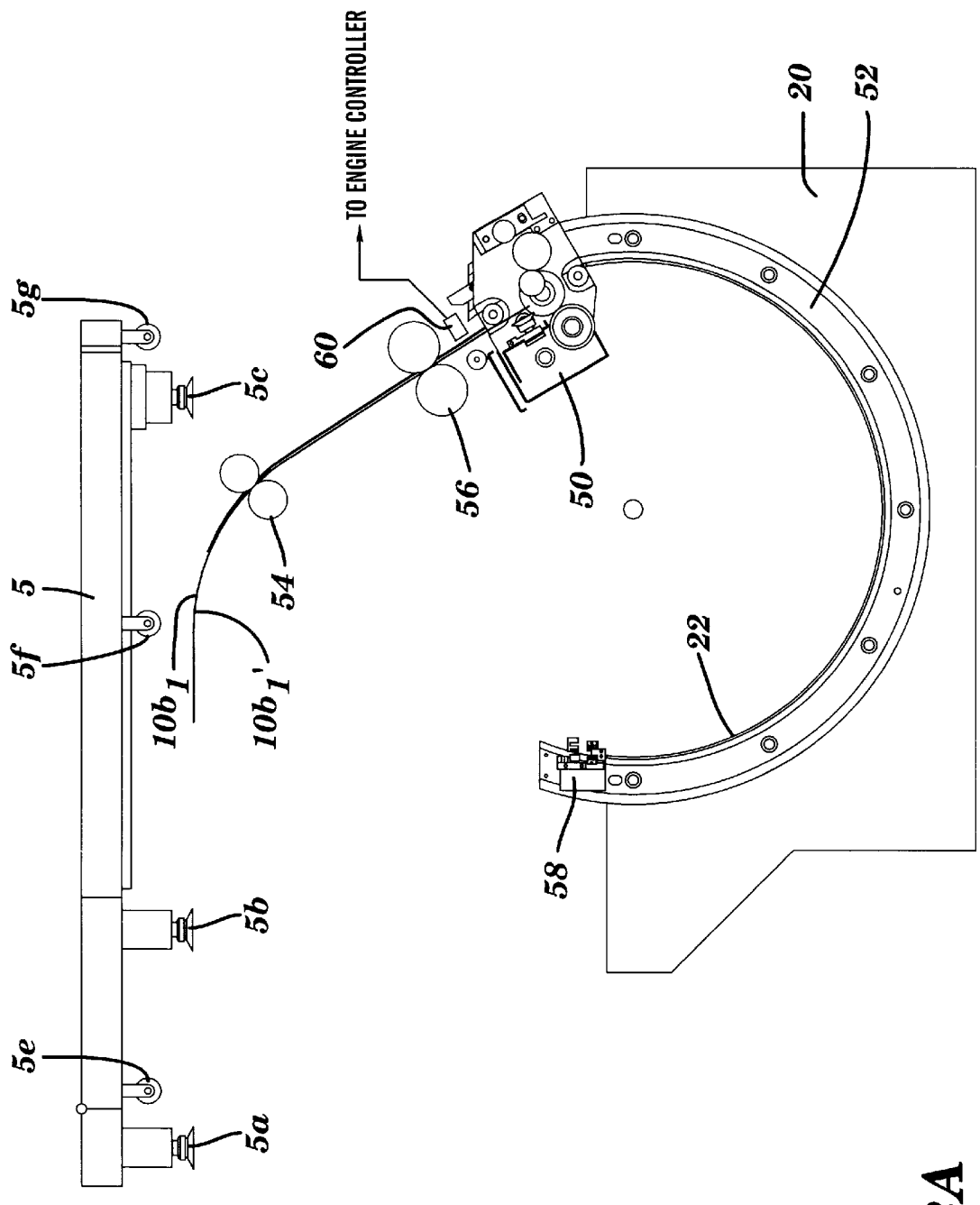
FIG. 2A depicts the delivery of a sheet of media in the FIG. 1 system, in accordance with the present invention.

FIG. 2A depicts the initial delivery of a plate $10b_1$ by the plate picker 5 to the applicator 50. FIG. 2A provides further detail of the plate picker 5. As shown, the plate picker 5 includes suction cups 5a–c. The vacuum created by the operation of the suction cups 5a–5c is distributed onto a major portion of the top surface of the plate $10b_1$ to lift the plate $10b_1$ from the handler cassette 4b and to hold the plate $10b_1$ as it is moved from the handler 4 to the applicator 50. As shown, rollers or wheels 5e–g are provided for moving the plate picker 5 between the handler 4 and the far side of the cylindrical drum 20. The rollers 5e–g ride along tracks or rails (not shown) which guide its movement between the handler 4 and drum 20.

As noted above, the plate picker 5 lifts and conveys the plate $10b_1$ by contacting only the top side of the plate. Because the plates are stored in the cassette 4b, as well as the other cassettes, emulsion side down, the emulsion side of the plate $10b_1'$ is not contacted by the picker 5. As shown, the plate picker 5 moves the plate $10b_1$ over the support surface 22 of the cylindrical drum 20 at a distance above the cylindrical drum 20. As will be described further below, this facilitates the buffering of a plate proximate to the applicator 50 when the applicator is moved to the upper right side of the cylindrical drum 20, i.e., its parked position.

As the plate picker 5 moves towards the applicator 50 the vacuum created by suction cups 5c is extinguished so that the leading edge of the plate $10b_1$ separates from the manifold 5h and is grabbed by the nips 54. The nips 54 rotate to drive and guide the leading edge of the plate $10b_1$ between the drive nips 56, under the control of engine controller 6. A sensing device 60 which preferably includes a light emitting diode (LED) for directing light onto the plate $10b_1$ and a light detector, for example a photodiode, for sensing light reflected by the plate $10b_1$, detects the passage of the leading edge of the plate $10b_1$. More particularly, when the leading edge of the plate reflects the light emitted by the LED, the detector senses the reflected light causing it to generate an electrical signal to the engine controller 6, thereby informing the engine controller 6 of the disposition of the plate $10b_1$. As shown in FIG. 2A, the engine controller 6 controls the nips 54 and 56 to drive the leading edge of the plate $10b_1$ to a predetermined position beyond the sensing device 60 so as to be accessible by the applicator 50.

A rail or track 52 is provided at each end of the drum 20 to guide the applicator 50 movement during positioning media on and removing media from the cylindrical drum mounting surface 22. A register pin and bar assembly 58, which is preferably of the type described in U.S. patent application Ser. No. 08/860,720, simultaneously filed on Jun. 4, 1997, the disclosure of which is incorporated herein by reference, is located at the upper left side of the cylindrical drum 20 and is used to position the leading edge of the media $10b_1$ as it is loaded by the applicator 50 onto the mounting surface 22. The drum 20 is preferably as described in U.S. patent application Ser. Nos. 08/867,128 and 08/868,526, simultaneously filed on Jun. 4, 1997, the disclosures of which are incorporated herein by reference.

Figure 2B:
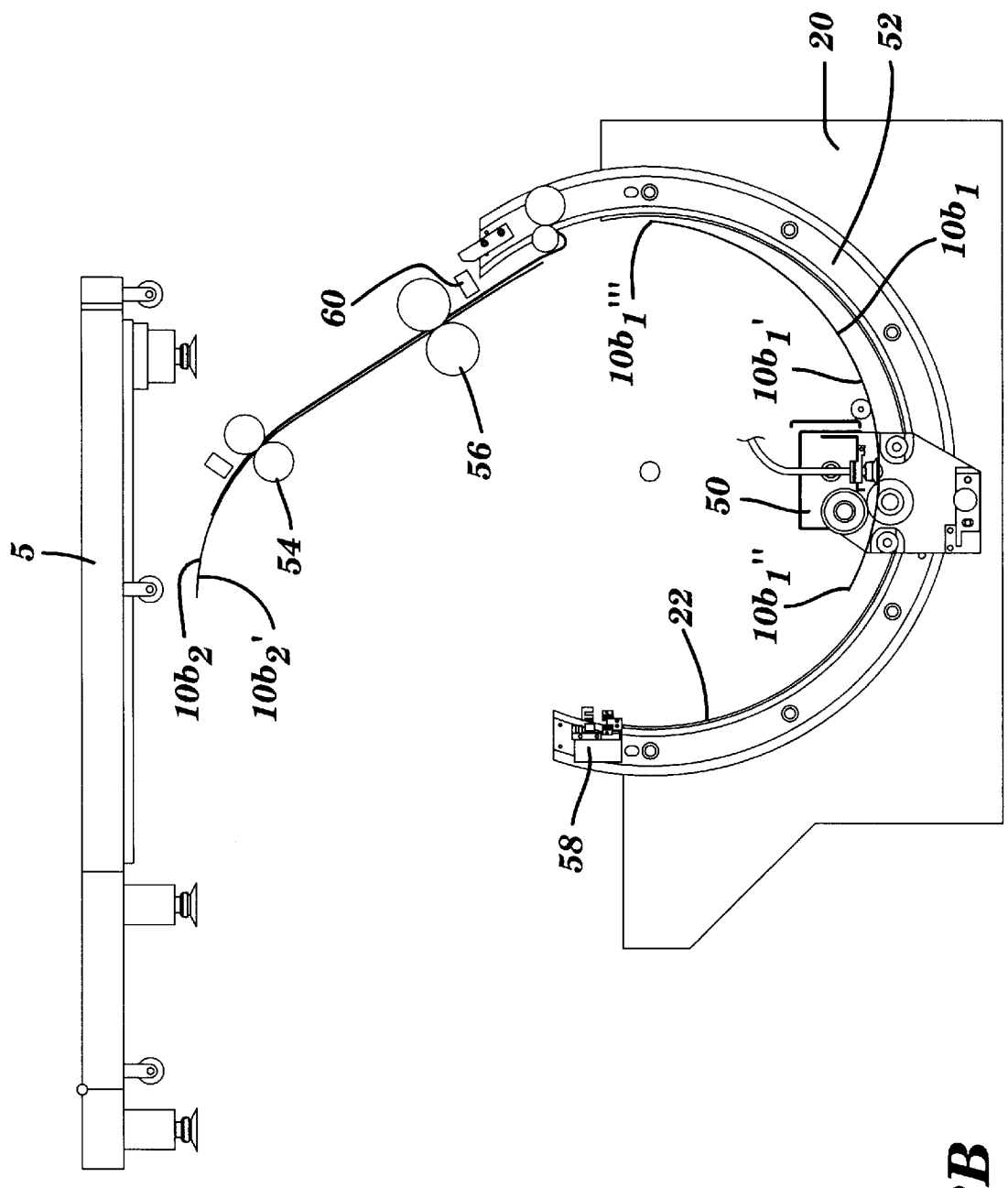
FIG. 2B depicts the loading of a sheet of media in the cylindrical drum of the FIG. 1 system, in accordance with the present invention.

FIG. 2B depicts the plate $10b_1$ being loaded by the applicator 50, leading edge $10b_1''$ first and trailing edge $10b_1'''$ last, onto the internal surface 22 of the cylindrical drum 20 emulsion side $10b_1'$ facing radially inward. Another plate $10b_2$ has been moved, during the loading of plate $10b_1$, by the plate picker 5 and the NIPS 54 and 56 to a buffer position over the mounting surface 22. The leading edge of plate $10b_2$ is disposed at the previously described distance past the sensing device 60. The emulsion side of the plate $10b_2'$ is down. The plate is, as shown, entirely released from the plate picker 5 during buffering. Accordingly, the plate picker 5 is controlled by controller 6 to return to a position over the cassette 4b to begin delivery of yet another plate to the applicator 50 after the release of the plate $10b_2$.

Figure 2C:
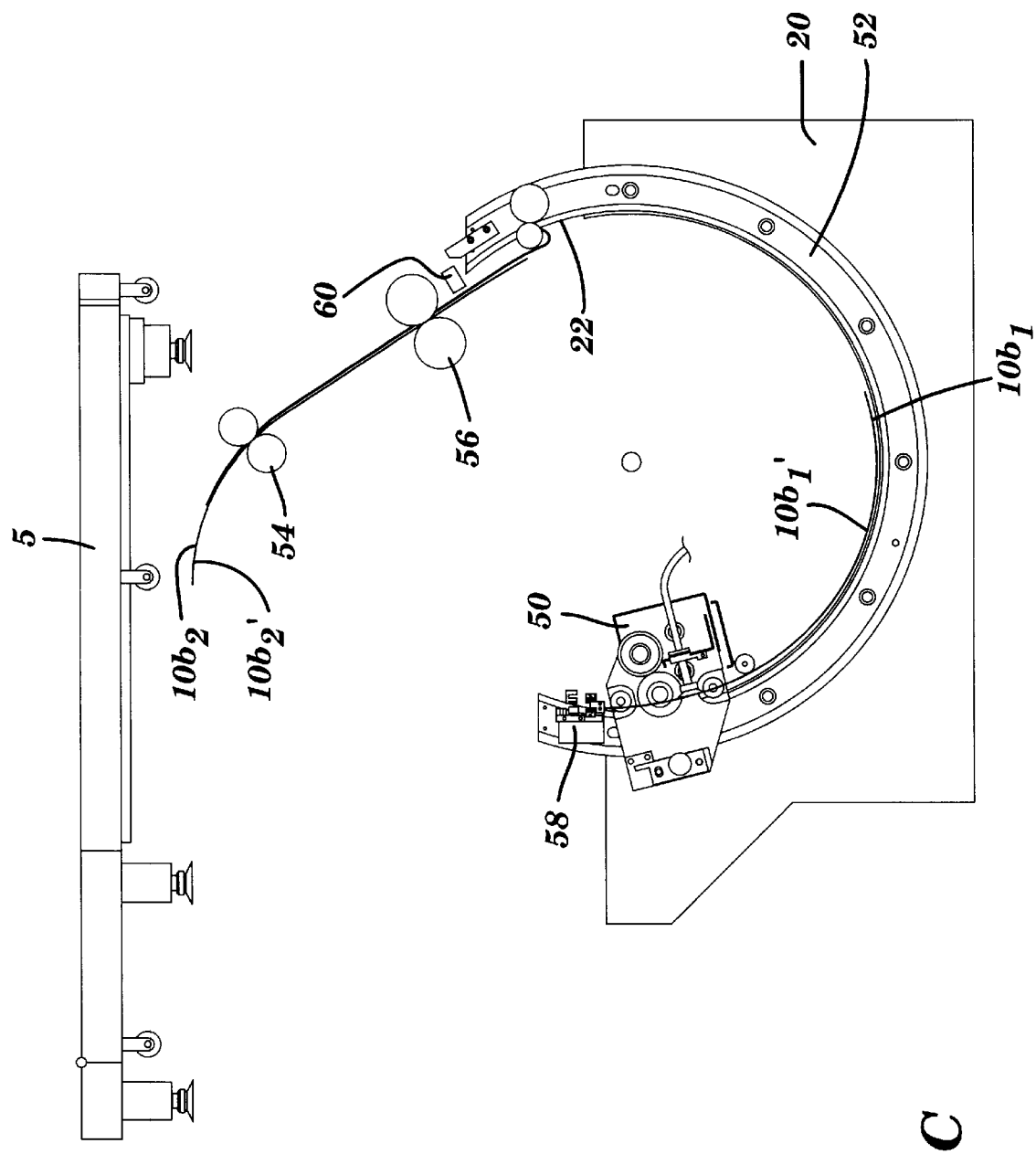
FIG. 2C depicts the buffering of another sheet of medium in the FIG. 1 system, in accordance with the present invention.

In FIG. 2C the applicator 50 has loaded the plate $10b_1$ onto the mounting surface 22 of the cylindrical drum 20 but has yet to complete the final positioning of the plate $10b_1$. As indicated, the emulsion side of the plate $10b_1'$ is positioned facing radially inward within the cylindrical drum 20.

Figure 2D:
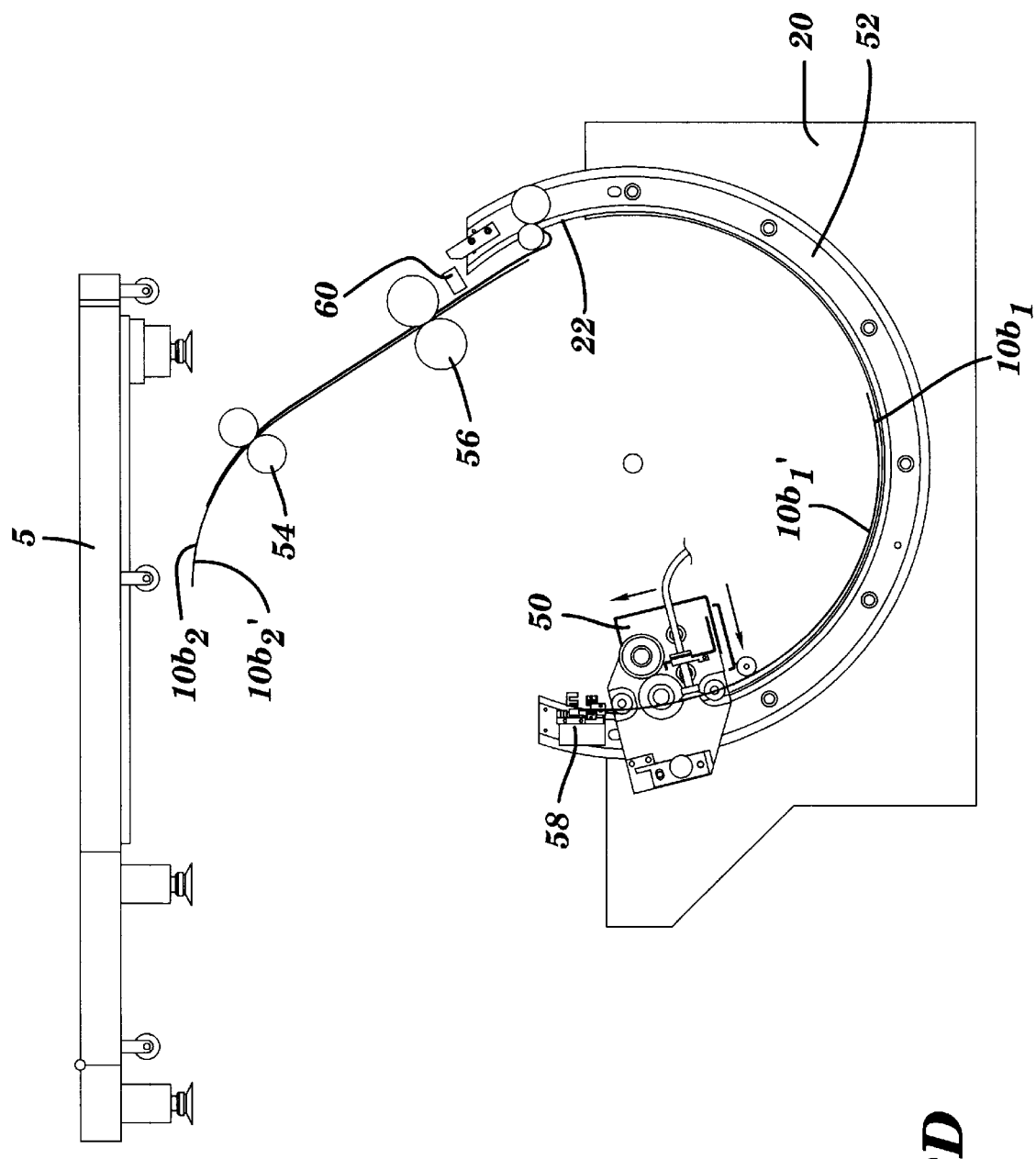
FIG. 2D depicts the final positioning of the first sheet of media in the cylindrical drum of the FIG. 1 system, in accordance with the present invention.

FIG. 2D depicts the final positioning of the plate $10b_1$ against the register assembly 58. The plate $10b_2$ remains in the buffered position above the support surface 22 of the cylindrical drum 20. The plate $10b_1$ can now be imaged by a scan assembly (not shown) to read or record an image on the media $10b_1$.

Figure 2E:
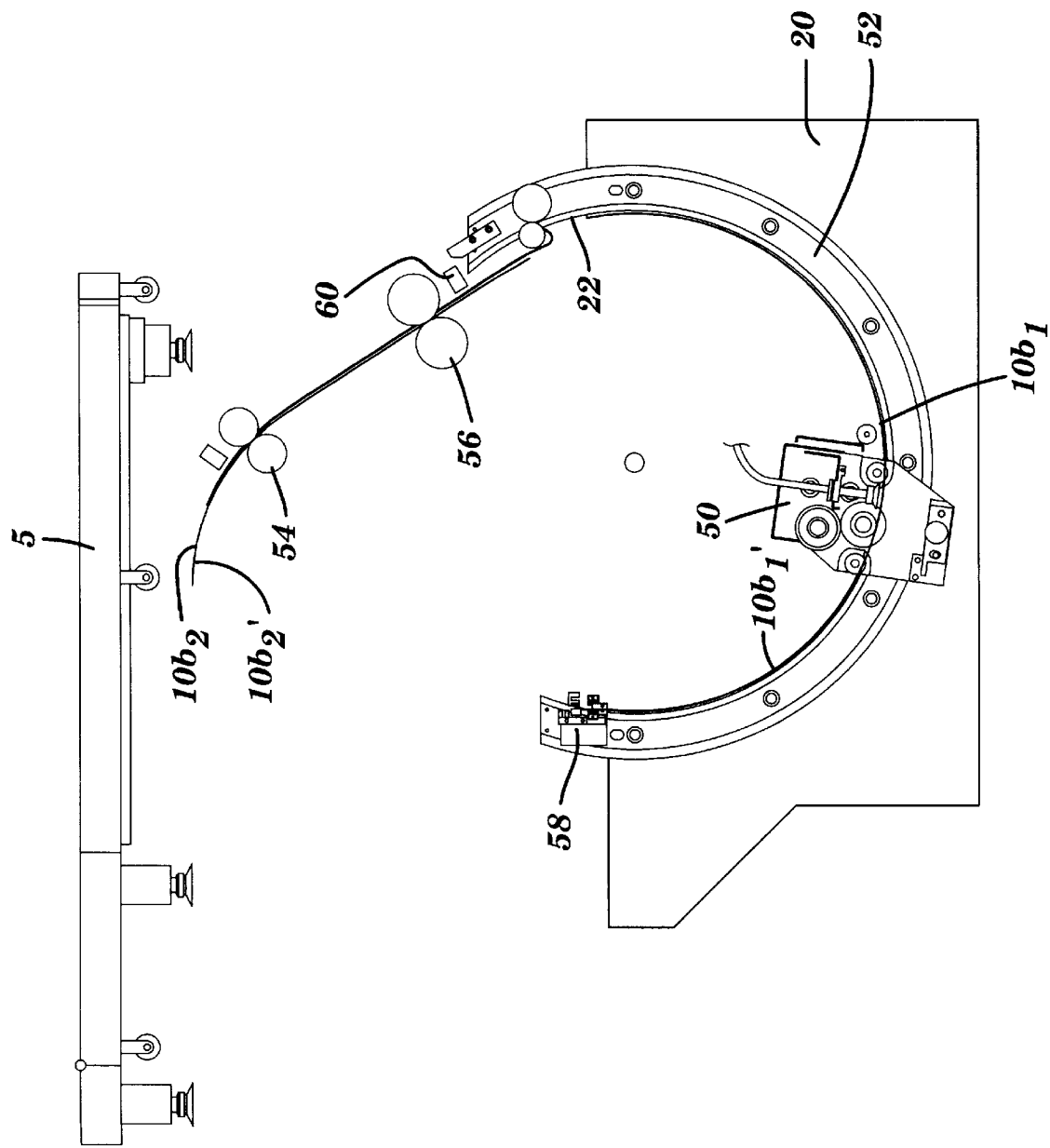
FIG. 2E depicts the movement of the applicator in preparation for removal of the imaged first sheet of media from the cylindrical drum of the FIG. 1 system, in accordance with the present invention.

FIG. 2E is similar to FIG. 2D with the exception that the applicator 50 has been moved in preparation for removal of the plate $10b_1$ after imaging has been completed. Here again it should be noted that the plate $10b_2$ remains in the buffered position.

Figure 2F:
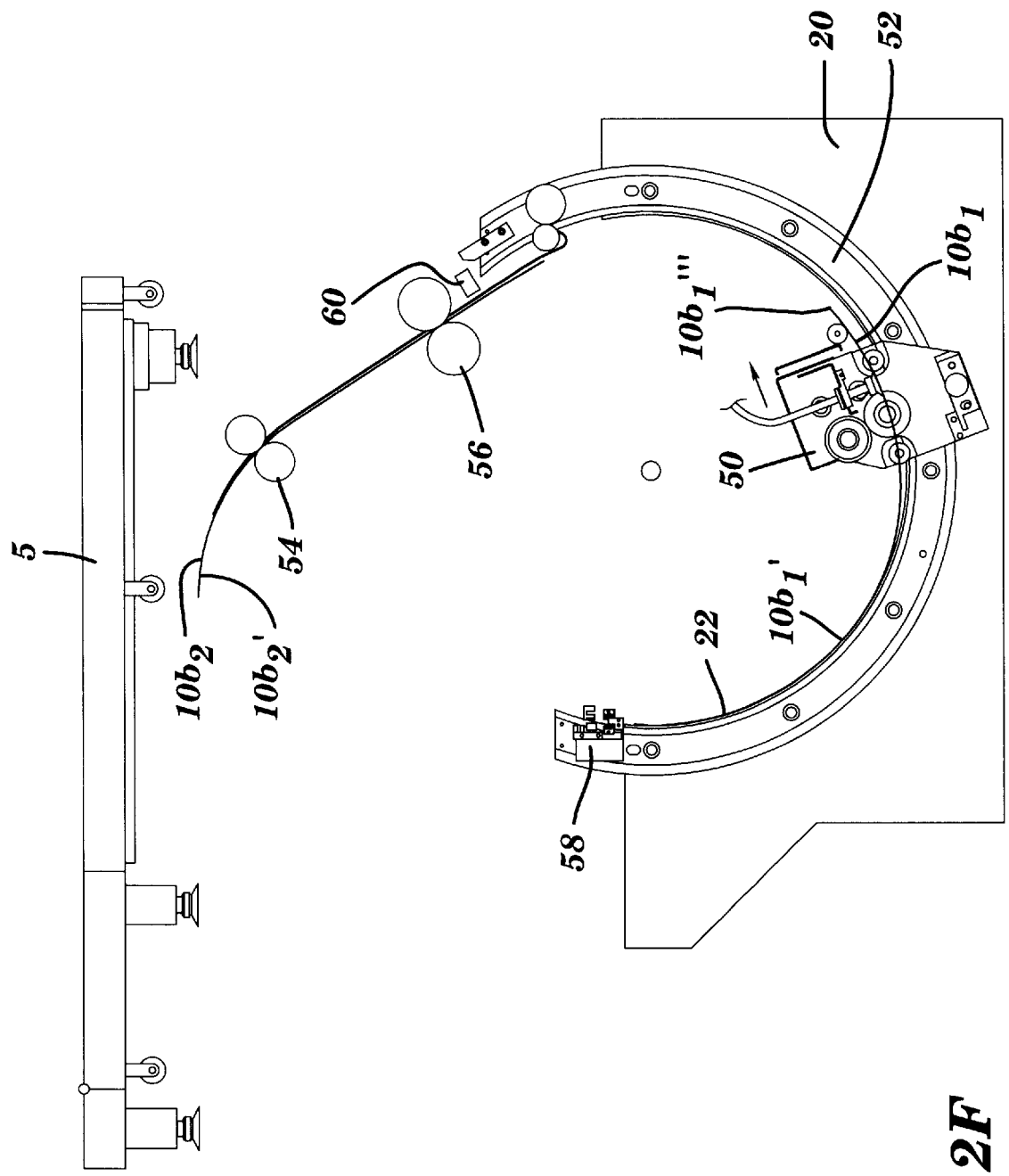
FIG. 2F depicts the initiation of removal of the imaged first sheet of media from the cylindrical drum of the FIG. 1 system, in accordance with the present invention.

FIG. 2F depicts the applicator 50 beginning the removal of the plate $10b_1$ from the mounting surface 22 of the cylindrical drum 20. It should be noted here that the applicator 50 which was moved clockwise along the rails 52 to position the plate $10b_1$ onto the support surface 22 now moves counter clockwise along the rails 52 to remove the plate $10b_1$ from the mounting surface 22. Accordingly, the edge $10b_1''$, which was the leading edge of the plate $10b_1$ as it was being positioned on the support surface 22 as shown in FIG. 2B, is the trailing edge of the plate $10b_1$ as it is removed by the applicator 50 from the mounting surface 22 of the cylindrical drum 20. Similarly, the edge $10b_1'''$, which was the trailing edge of the plate $10b_1$ as it was being loaded onto the mounting surface 22 of drum 20, is the leading edge of the plate $10b_1$ as it is removed from the mounting surface 22 of the cylindrical drum 20.

Figure 2G:
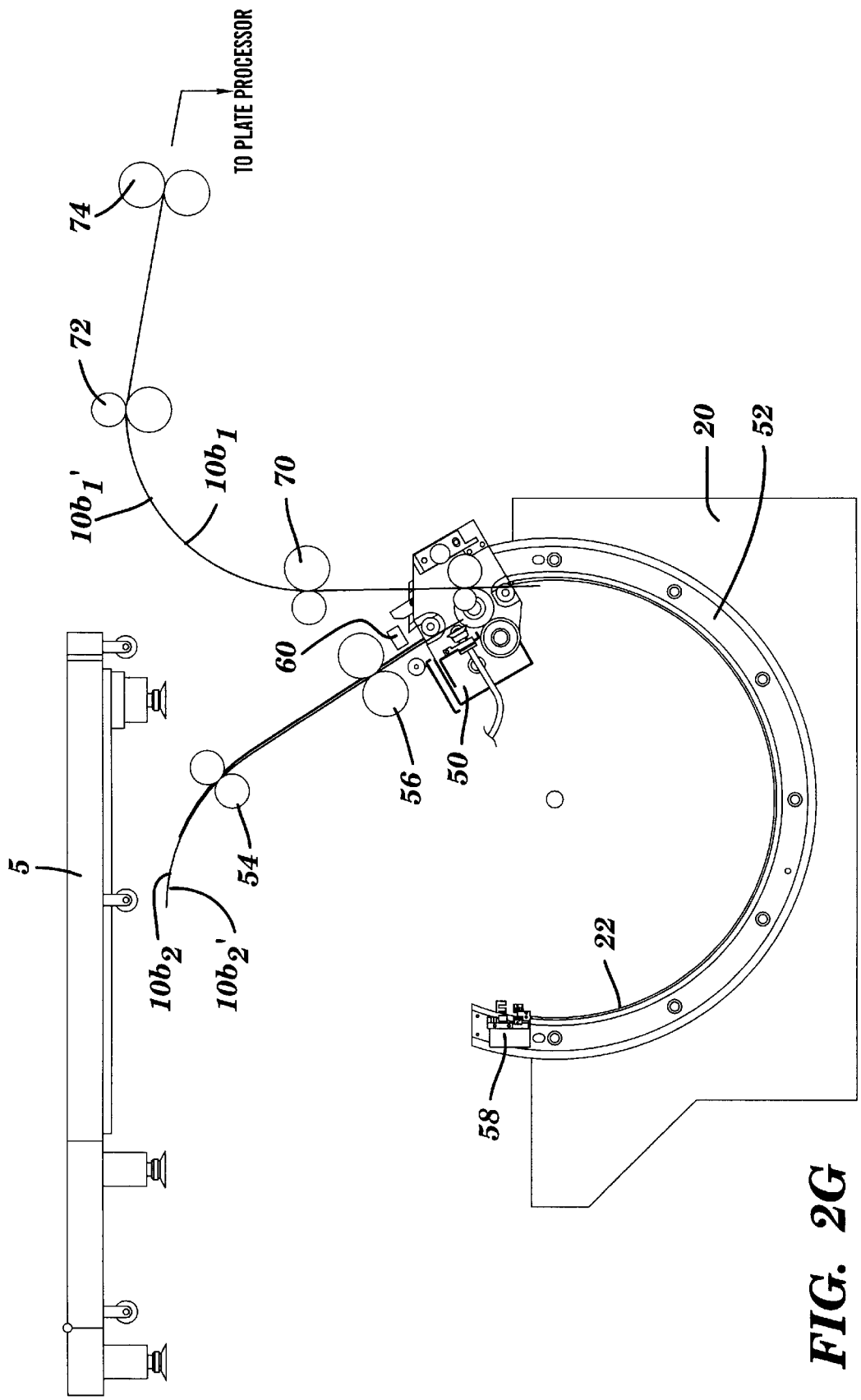
FIG. 2G depicts the buffering of the imaged first sheet of media removed from the cylindrical drum of the FIG. 1 system, in accordance with the present invention.

FIG. 2G shows the plate $10b_1$ having been removed from the support surface 22 of the cylindrical drum 20 by the applicator 50, and fed to the imaged media delivery system which includes nips 70–74. The nips 70–74, controlled by controller 6, drive and guide the plate $10b_1$ to a buffer position proximate to the plate processor 9. The plate $10b_1$ is buffered until the plate processor 9 has been emptied of any other processed plate. After removal of a processed plate from the processor 9, the nips 70–74 are controlled by the engine controller 6 to drive the plate $10b_1$ into the plate processor 9 for processing.

Figure 2H:
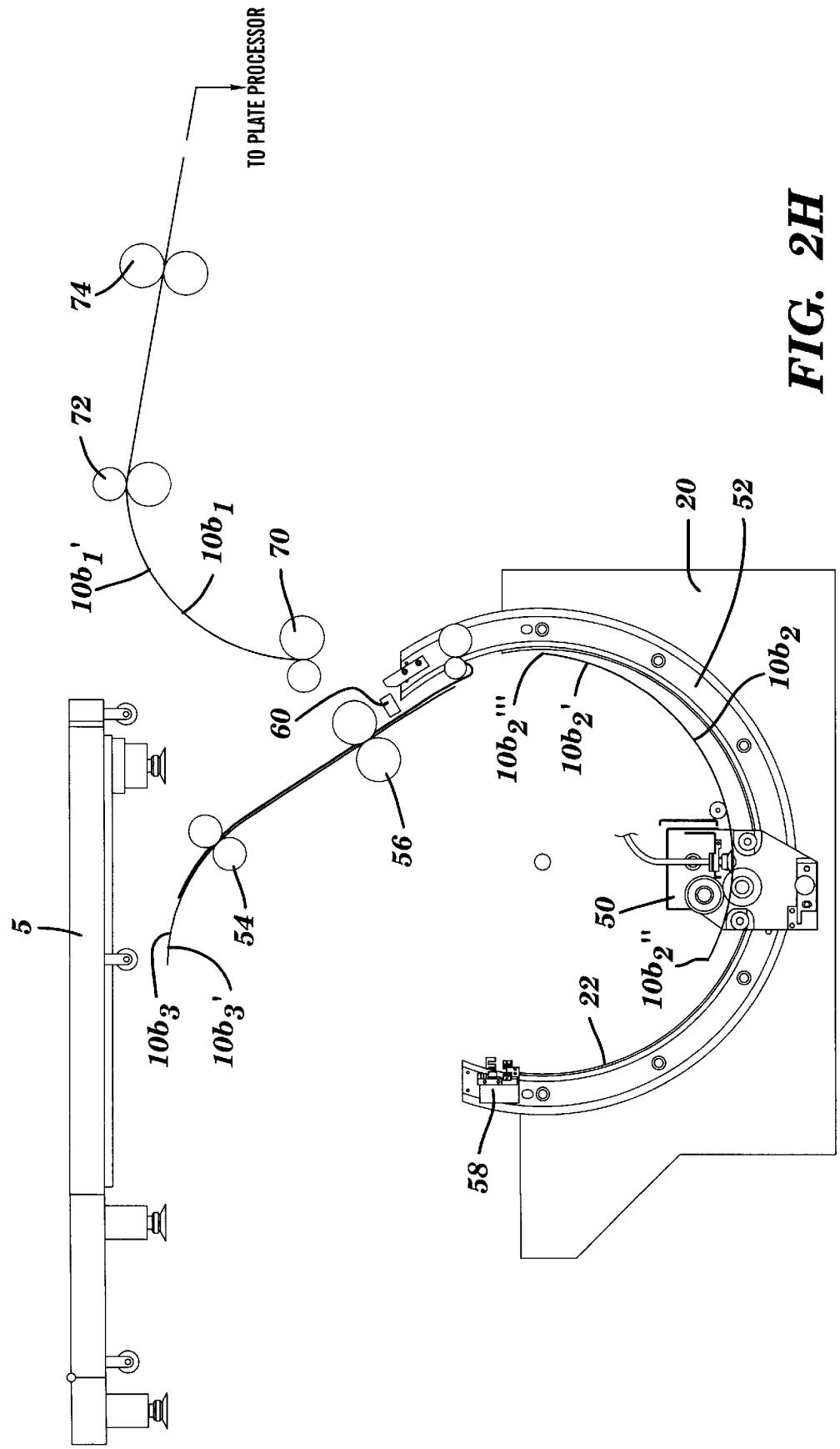
FIG. 2H depicts the buffering of two sheets of media as a third sheet of media is positioned in the cylindrical drum of the FIG. 1 system, in accordance with the invention.

FIG. 2H depicts the plate $10b_1$ in a buffered position awaiting loading in the plate processor 9. Simultaneously, the plate $10b_2$ is positioned on the mounting surface 22 of the cylindrical drum 20 by the applicator 50. At the same time, a third plate $10b_3$, which has an emulsion side $10b_3'$, is buffered above the mounting surface 22 of the cylindrical drum 20. Accordingly, the imaging system has two plates buffered and one plate being positioned in the cylindrical drum 20 for imaging.

As described in detail above, the present invention provides an imaging system which loads and unloads medium in a highly efficient manner. The system facilitates the storage of the media emulsion time down and the imaging of different size media.

It will also be recognized by those skilled in the art that, while the invention has been described above in terms of one or more preferred embodiments, it is not limited thereto. Various features and aspects of the above described invention may be used individually or jointly. Further, although the invention has been described in the context of its implementation in a particular environment and for particular purposes, those skilled in the art will recognize that its usefulness is not limited thereto and that the present inven-

We claim:

1. An imaging system for imaging medium while supported at an imaging position on a support surface, comprising:
a storage device configured to store medium to be imaged;
a loading device configured to move the medium to be imaged to the imaging position on the support surface; and
a delivery device configured to move the medium to be imaged over the support surface and distanced therefrom, to thereby deliver the medium from the storage device to the loading device.

2. An imaging system according to claim 1, wherein the storage device is further configured to store the medium emulsion side down.

3. An imaging system according to claim 2, wherein the delivery device is further configured to move the medium without contacting the emulsion side of the medium.

4. An imaging system according to claim 1, wherein the storage device includes a medium handler for simultaneously storing different size medium, and further comprising:
an input device configured immediately after receive a command representing a selection of one of the different size medium and to generate a signal representing the command; and
a handler controller for controlling the handler in accordance with the signal to provide the delivery device with access to the selected medium.

5. An imaging system according to claim 1, wherein:
the medium has a leading edge and a trailing edge as the loading device moves the medium onto the support surface; and
the loading device is further configured to remove the medium from the support surface trailing edge first.

6. An imaging system according to claim 1, wherein the loading device is further configured to move the medium to be imaged along the support surface to the imaging position.

7. An imaging system according to claim 1, further comprising:
an engine controller for simultaneously controlling the delivery device to move another medium to be imaged from the storage device proximate to the support surface and the loading device to move the medium to be imaged to the imaging position on the support surface.

8. An imaging system according to claim 1, further comprising:
an engine controller for controlling the delivery device to buffer the medium to be imaged over the support surface and distanced therefrom prior to another medium being removed from the support surface.

9. An imaging system according to claim 1, wherein the medium to be imaged has a surface and a thickness and, with the medium to be imaged over the support surface, at least a portion of the surface of the medium faces the support surface and is distanced therefrom by a separation distance greater than the thickness of the medium.

10. An imaging system according to claim 9, wherein the surface of the medium is one of two opposed primary surfaces of the medium and the thickness equals a distance between the opposed primary surfaces of the medium.

11. An imaging system according to claim 10, wherein the one opposed primary surface is part of an the emulsion side of the medium.

12. An imaging system for imaging media while supported at an imaging position on a support surface, comprising:
a storage device configured to store the media to be imaged;
a loading device configured to move the media, a sheet at a time, to the imaging position on the support surface and to remove the imaged media, a sheet at a time, from the support surface;
a media delivery device configured to move the media, a sheet at a time, from the storage device to the loading device;
a media processor configured to process the imaged media a sheet at a time;
an imaged media delivery device configured to move the imaged media, a sheet at a time, from the loading device to the media processor; and
a controller for controlling the imaging system such that the media delivery device moves a first sheet of medium from the storage device to a location proximate to the loading device after the loading device has begun to move a second sheet of medium to the imaging position on the support surface and before the loading device has removed the imaged second sheet of medium from the support surface.

13. An imaging system according to claim 12, wherein the controller is further configured to control the media delivery device to maintain the first sheet of medium in a buffer position prior to the second sheet of medium being removed from the support surface.

14. An imaging system according to claim 12, wherein the controller is further configured to control the imaged media delivery device to move an imaged third sheet of medium from the loading device to a location proximate to the media processor before an imaged fourth sheet of medium has been removed from the image processor.

15. An imaging system according to claim 14, wherein the controller is further configured to control the imaged media delivery device to maintain the third sheet of medium in a buffer position prior to the fourth sheet of medium being removed from the image processor.

16. An imaging system for imaging media while supported at an imaging position on a support surface, the imaging system, comprising:
a storage device configured to store the media to be imaged;
a loading device configured to move the media, a sheet at a time, to the imaging position on the support surface and to remove the imaged media, a sheet at a time, from the support surface;
a media delivery device configured to move the media, a sheet at a time, from the storage device to the loading device;
a media processor configured to process the imaged media a sheet at a time;
an imaged media delivery device configured to move the imaged media, a sheet at a time, from the loading device to the media processor; and
a controller for simultaneously controlling the media delivery device to move a first sheet of medium from the storage device to the loading device, the loading device to move a second sheet of medium to the imaging position on the support surface, and the imaged media delivery device to move an imaged third sheet of medium from the loading device to the media processor.

17. An imaging system for imaging media while supported at an imaging position on a support surface, the imaging system, comprising:

a storage device configured to store the media to be imaged;

a loading device configured to move the media, a sheet at a time, to the imaging position on the support surface and to remove the imaged media, a sheet at a time, from the support surface;

a media delivery device configured to move the media, a sheet at a time, from the storage device to the loading device;

a media processor configured to process the imaged media a sheet at a time; and an imaged media delivery device configured to move the imaged media, a sheet at a time, from the loading device to the media processor;

wherein the media delivery device buffers a first sheet of medium between the storage device and the loading device prior to the loading device removing a second sheet of medium from the support surface and the imaged media delivery device buffers an imaged third sheet of medium between the loading device and the media processor prior to a fourth sheet of medium being removed from the image processor.

18. An imaging system according to claim 17, wherein the media delivery device buffers the first sheet of medium and the imaged media delivery device buffers the imaged third sheet of medium simultaneously.

19. A method of imaging medium while supported at an imaging position on a support surface, comprising the steps of:

moving the medium to be imaged to a position over the support surface and distanced therefrom; and then moving the medium to the imaging position on the support surface.

20. A method of imaging according to claim 19, wherein the medium is moved over the support surface emulsion side down.

21. A method of imaging according to claim 20, wherein the medium is moved over the support surface without contacting the emulsion side of the medium.

22. A method of imaging according to claim 19, wherein the medium has a leading edge and a trailing edge as the medium is moved onto the support surface, and further comprising the step of:

removing the medium from the support surface with the trailing edge leading the movement.

23. A method for imaging according to claim 19, further comprising the step of:

simultaneously moving the medium to the imaging position on the support surface and another medium to the position over the support surface and distanced therefrom.

24. A method of imaging according to claim 19, further comprising the step of:

buffering the medium over the support surface and distanced therefrom prior to removing another medium from the support surface.

25. A method according to claim 19, wherein the medium to be imaged has a surface and a thickness, and the medium to be imaged is moved to a position over the support surface such that at least a portion of the surface of the medium faces the support surface and is distanced therefrom by a separation distance greater than the thickness of the medium.

26. A method according to claim 25, wherein the surface of the medium is one of two opposed primary surfaces of the medium and the thickness equals a distance between the opposed primary surfaces of the medium.

27. An imaging system according to claim 26, wherein the one opposed primary surface of the medium is part of an the emulsion side of the medium.

28. A method of imaging media while supported at an imaging position on a support surface, comprising the steps of:

moving the media, a sheet at a time, to a first buffer position proximate to the support surface;

moving the media, a sheet at a time, from the first buffer position to the imaging position on the support surface and removing imaged media, a sheet at a time, from the support surface;

moving the removed imaged media, a sheet at a time, to a second buffer position proximate a media processor; and moving the removed imaged media, a sheet at a time, from the second buffer position to the media processor;

wherein a first sheet of medium is moved to the first buffer position after a second sheet of medium is moved towards the imaging position on the support surface and before the second sheet of medium is removed from the support surface.

29. A method of imaging according to claim 28, wherein an imaged third sheet of medium is moved to the second buffer position before an imaged fourth sheet of medium is removed from the image processor.

30. A method of imaging media while supported at an imaging position on a support surface, comprising the steps of:

moving the media, a sheet at a time, to a first buffer position proximate the support surface;

moving the media, a sheet at a time, to the imaging position on the support surface;

removing the imaged media, a sheet at a time, from the support surface;

moving the imaged media, a sheet at a time, to a second buffer position proximate to a media processor; and processing the imaged media, a sheet at a time, in the image processor;

wherein a first sheet of medium is moved to the first buffer position, a second sheet of medium is moved to the imaging position on the support surface, and an imaged third sheet of medium is moved to the second buffer position simultaneously.

31. A method of imaging media while supported at an imaging position on a support surface, comprising the steps of:

moving the media, a sheet at a time, to a first buffer position proximate the support surface;

moving the media, a sheet at a time, to the imaging position on the support surface;

removing the imaged media, a sheet at a time, from the support surface;

moving the imaged media, a sheet at a time, to a second buffer position proximate to a media processor; and processing the imaged media, a sheet at a time, in the image processor;

wherein a first sheet of medium is moved to the first buffer position prior to a second sheet of medium being removed from the support surface, and an imaged third sheet of medium is moved to the second buffer position prior to a fourth sheet of media being removed from the image processor.

32. A method of imaging according to claim 31, wherein the first sheet of medium is in the first buffer position and the imaged third sheet of medium is in the second buffer position simultaneously.

* * * * *